United States Patent
Kuwahara

(10) Patent No.: US 6,219,393 B1
(45) Date of Patent: Apr. 17, 2001

(54) SEMICONDUCTOR INTEGRATED CIRCUIT DEVICE

(75) Inventor: Masanori Kuwahara, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/022,747

(22) Filed: Feb. 12, 1998

(30) Foreign Application Priority Data

Feb. 25, 1997 (JP) ................................................. 9-040540

(51) Int. Cl.[7] ....................................................... H04L 7/00
(52) U.S. Cl. .......................... 375/354; 375/355; 375/377; 327/141; 327/142; 327/147; 327/153
(58) Field of Search ..................................... 375/354, 355, 375/377; 327/141, 142, 147, 153, 156, 161

(56) References Cited

U.S. PATENT DOCUMENTS

| | | | |
|---|---|---|---|
| 4,450,572 | * 5/1984 | Stewart et al. .......................... 375/87 |
| 5,122,694 | * 6/1992 | Bradford et al. ...................... 307/480 |
| 5,297,261 | * 3/1994 | Kuranaga ............................. 395/325 |
| 5,367,543 | * 11/1994 | Uomoto ................................ 375/116 |
| 5,418,816 | * 5/1995 | Yamamoto ........................... 375/230 |
| 5,510,740 | * 4/1996 | Farrell et al. ......................... 327/142 |
| 5,825,706 | * 10/1998 | Snowden et al. ..................... 365/222 |
| 5,886,582 | * 3/1999 | Stansell ................................ 331/1 A |

* cited by examiner

Primary Examiner—Stephen Chin
Assistant Examiner—Dac V. Ha
(74) Attorney, Agent, or Firm—Hogan & Hartson, LLP

(57) ABSTRACT

A semiconductor integrated circuit device capable of carrying out reliable reset operation is provided. This semiconductor integrated circuit device comprises a first circuit which is reset on the basis of reset signal $S_R$ and serves to generate clock signal $f_i$, a delay circuit adapted to receive the reset signal to output a delayed reset signal $S_{DR}$, and a second circuit including a flip-flop operative in synchronism with the generated clock signal $f_i$ and serving to take thereinto the delayed reset signal $S_{DR}$ in synchronism with the generated clock signal $f_i$.

18 Claims, 5 Drawing Sheets

SEMICONDUCTOR INTEGRATED CIRCUIT DEVICE

TECHNICAL FIELD OF THE INVENTION

This invention relates to a semiconductor integrated circuit device comprising flip-flop for taking thereinto a reset signal in synchronism with a clock signal.

PRIOR ART

Generally, a semiconductor integrated circuit device 40 comprising a flip-flop for taking thereinto a reset signal in synchronism with a clock signal includes, as shown in FIG. 7, a clock generating circuit 2 and an operating circuit 6. The clock generating circuit 2 generates, on the basis of a clock signal $f_{ex}$ sent from the outside, a clock signal $f_i$ having frequency different from frequency of this clock signal $f_{ex}$. The operating circuit 6 is a circuit including a portion operative in synchronism with the clock signal $f_i$.

It is now assumed that the clock generating circuit 2 and the operating circuit 6 respectively include flip-flops. Particularly, such a flip-flop for which application of clock pulse is required at the time of reset of the operating circuit is necessarily included in the operating circuit 6, and that clock is assumed to be delivered from the clock generating circuit 2. Such a flip-flop takes thereinto reset signal for carrying out clear operation or preset operation in synchronism with clock. On the other hand, whether or not the flip-flop included in the clock generating circuit 2 requires application of clock pulse in the reset operation is arbitrary.

Hereinafter, the clear operation and the preset operation of the flip-flop carried out at the time of reset are assumed to be collectively called "reset operation". In addition, such a flip-flop to take thereinto reset signal in synchronism with clock is assumed to be called "Synchronous reset type flip-flop".

The conventional semiconductor integrated circuit device 40 constituted as described above is used in a manner as described below. For example, in the case where because frequency of the clock signal $f_{ex}$ is too high, the operating circuit 6 is unable to become operative in synchronism with the clock signal $f_{ex}$ from a viewpoint of performance, the device 40 is used in such a manner that the clock signal $f_{ex}$ is frequency-divided by the clock generating circuit 2 to generate a clock signal $f_i$ of low frequency thereafter to allow the operating circuit 6 to be operative by using this clock signal $f_i$. In this case, the clock generating circuit 2 is realized as a frequency-dividing circuit. In addition, the device 40 is used also in such a manner to generate, as clock signal $f_i$, clock in which the clock signal $f_{ex}$ is caused to be high speed clock to allow the operating circuit 6 to be operative by using this clock signal $f_i$. In this case, the clock generating circuit 2 is realized as a multiplication circuit.

Let now consider the case where reset signal is inputted from the outside to the semiconductor integrated circuit device 40 shown in FIG. 7.

A semiconductor integrated circuit device 50 in the case where reset signal $S_R$ is applied to the semiconductor integrated circuit device 40 of FIG. 7 is shown in FIG. 8. The reset signal $S_R$ is delivered to both clock generating circuit 2 and operating circuit 6 in order to initialize flip-flops included in the clock generating circuit 2 and the operating circuit 6.

However, in the semiconductor integrated circuit device 50 constituted as shown in FIG. 8, it is indicated in a manner as described below that the reset operation is not correctly carried out in the operating circuit 6. Since the clock generating circuit 2 is initialized for a time period during which the reset signal $S_R$ is in enable state, no clock pulse is outputted to the operating circuit 6. For this reason, the synchronous reset type flip-flop within the operating circuit 6 cannot take reset signal $S_R$ thereinto. After the reset signal $S_R$ is released and the clock generating circuit 2 thus begins to operate, clock pulse $f_i$ is outputted to the operating circuit 6. For this reason, the operating circuit 6 cannot take thereinto reset signal by clock signal $f_i$. Thus, reset operation is not carried out in connection with the operating circuit 6. Namely, in order to reset the synchronous reset type flip-flop within the operating circuit 6, it is necessary that both reset signal and clock for taking it thereinto after undergone synchronization are delivered to the operating circuit 6. However, in the case of the circuit configuration of FIG. 8, since clock signal $f_i$ is not generated for a time period during which reset signal is generated, the reset operation is not carried out.

SUMMARY OF THE INVENTION

This invention has been made in view of the above-mentioned circumstances, and its object is to provide a semiconductor integrated circuit device capable of carrying out reliable reset operation.

A semiconductor integrated circuit device according to this invention comprises a first circuit which is reset on the basis of a reset signal to generate a clock signal, a delay circuit responsive to the reset signal to output a delayed reset signal, and a second circuit including a flip-flop operative in synchronism with the clock signal thus generated to take thereinto the delayed reset signal in synchronism with the generated clock signal.

In this case, the first circuit may be a frequency-dividing circuit for frequency-dividing an external clock signal delivered from the outside to thereby generate the clock signal.

Moreover, the first circuit may be a multiplication circuit for carrying out multiplication of an external clock signal delivered from the outside to thereby generate the clock signal.

Further, the first circuit may be a PLL circuit for extracting the clock signal from input data delivered from the outside.

Further, a semiconductor integrated circuit device of this invention may be constituted as a communication control unit for carrying out control of the physical layer in the hierarchical protocol of communication, wherein the second circuit is a data processing unit for implementing a predetermined processing to the input data in synchronism with a clock signal outputted from the PLL circuit to deliver the data thus processed to a control unit of high order protocol hierarchy.

Further, a semiconductor integrated circuit device of this invention comprises a communication control unit including a frequency-dividing element (frequency divider) which is reset by a reset signal to carry out frequency division of an external clock signal sent from the outside so that its frequency is changed into 1/n value, a serial/parallel converting circuit which is reset by the reset signal and is operative to convert, on the basis of the external clock signal and a frequency-divided clock signal which is output of the frequency divider, serial received data sent in synchronism with the external clock signal into n bit parallel data, a delay circuit adapted to receive the reset signal to output a delayed reset signal, and a data processing circuit including a flip/flop for taking thereinto the delayed reset signal in synchronism with the frequency-divided clock signal to implement a predetermined processing to the n bit parallel data in synchronism with the frequency-divided clock signal to deliver it to a control unit of high order protocol hierarchy.

Further, the delay circuit may be comprised of a RC integrating circuit or an inverter chain.

In addition, the delay circuit may be comprised of a shift register operative in synchronism with a clock signal.

DESCRIPTION OF THE PREFERRED EMBODIMENTS

Figure 1:
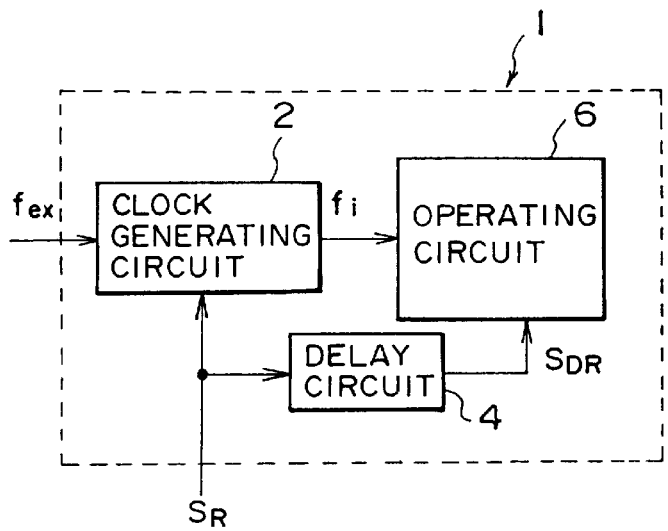
FIG. 1 is a block diagram showing the configuration of a first embodiment of this invention.

The configuration of a first embodiment of a semiconductor integrated circuit device according to this invention is shown in FIG. 1. The semiconductor integrated circuit device 1 of this embodiment comprises a clock generating circuit 2, a delay circuit 4, and an operating circuit 6.

Figure 9:
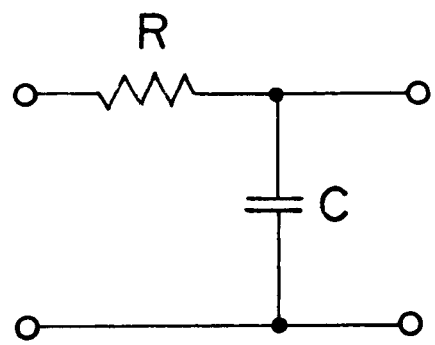
FIG. 9 is a circuit diagram showing a more practical example of a delay circuit according to this invention.
Figure 10:
FIG. 10 is a circuit diagram showing a further more practical example of a delay circuit according to this invention.

The clock generating circuit 2 is reset by a reset signal $S_R$ sent from the outside, and generates, on the basis of a clock signal $f_{ex}$ sent from the outside, a clock signal $f_i$ having frequency different from frequency of the clock signal $f_{ex}$. The delay circuit 4 generates a reset signal $S_{DR}$ obtained by delaying the reset signal $S_R$ to deliver it to the operating circuit 6. In this example, this delay circuit may be comprised of, e.g., a RC integrating circuit shown in FIG. 9 or an inverter chain shown in FIG. 10. The operating circuit 6 includes a flip-flop operative in synchronism with the clock signal $f_i$ to take thereinto the delayed reset signal $S_{DR}$ in synchronism with this clock signal $f_i$.

The operation of the semiconductor integrated circuit device of the first embodiment will now be described with reference to FIG. 2.

Figure 2:
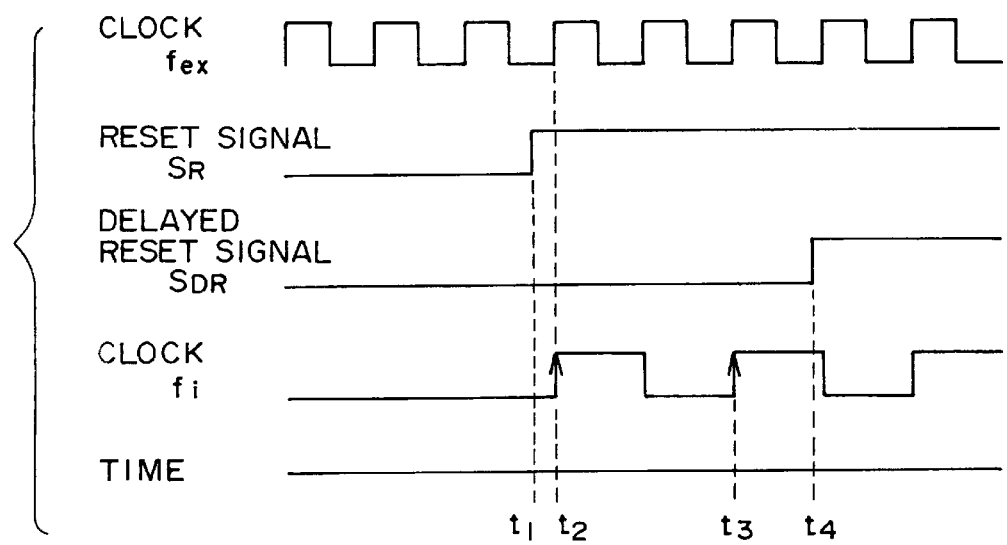
FIG. 2 is a timing chart for explaining the operation of the first embodiment.

In FIG. 2, reset signal $S_R$ and delayed reset signal $S_{DR}$ are respectively indicated as signals operative as an enable signal for low (L) level time period, and operative as disable signal for high (H) level time period. More particularly, the reset signal $S_R$ is assumed to be inputted so that it serves as an enable signal of low level until time $t_1$, and serves as a disable signal of high level from the time of $t_1$. Since the clock generating circuit 2 is not operated because it is reset for the time period during which the reset signal is at low level, clock signal $f_i$ which is output of the clock generating circuit 2 is not changed in the low level state.

On the other hand, the delayed reset signal $S_{DR}$ serves as a disable signal from time $t_4$ which is later than the time $t_1$. The delay time ($=t_4-t_1$) can be adjusted by suitably selecting delay elements constituting the delay circuit 4.

When the reset signal $S_R$ is placed in disable (high) state at time $t_1$, the clock generating circuit 2 starts operation. As a result, clock signal $f_i$ is generated at time $t_2$. For the time period during which the delayed reset signal $S_{DR}$ is in the enable (low level) state, clock signal $f_i$ is generated. At this time, rising of the clock appears twice (see times $t_2$, $t_3$). Thus, the synchronous reset type flip-flop included in the operating circuit 6 can take thereinto the reset signal at time $t_2$ or $t_3$ to carry out reset operation.

As explained above, in accordance with this embodiment, reliable reset operation can be carried out.

Figure 3:
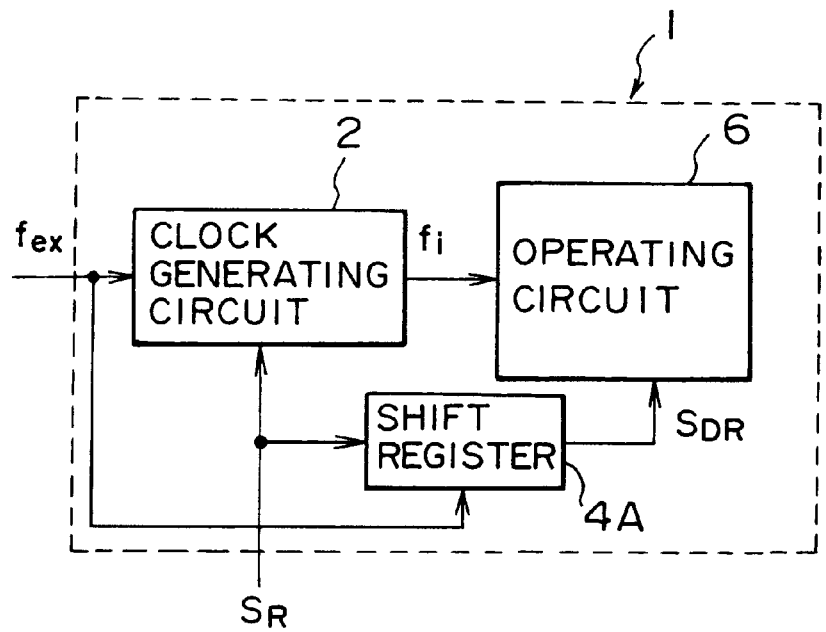
FIG. 3 is a block diagram showing the configuration of a second embodiment of this invention.

The configuration of a second embodiment of a semiconductor integrated circuit device according to this invention is shown in FIG. 3. The semiconductor integrated circuit device 1 of this embodiment is of a structure in which circuit 4 is replaced by delay circuit 4A in the first embodiment shown in FIG. 1.

Figure 4:
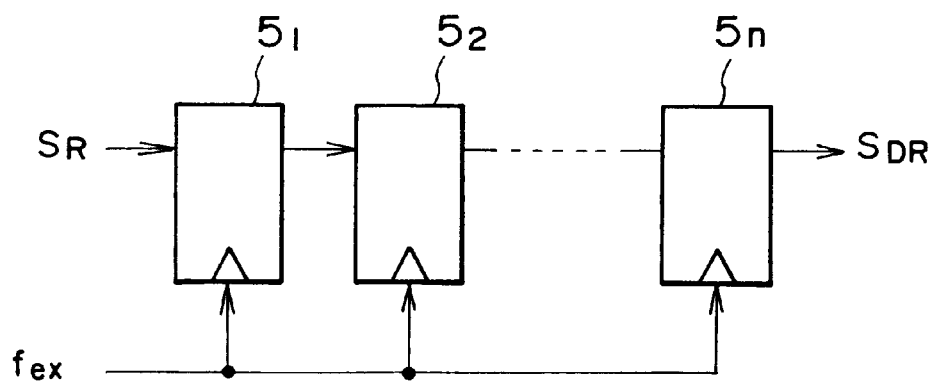
FIG. 4 is a circuit diagram showing a more practical example of a delay circuit according to the second embodiment.

This delay circuit 4A is comprised of a shift register operative in synchronism with a clock signal $f_{ex}$, and serves to delay a reset signal $S_R$ delivered from the outside to generate a delayed reset signal $S_{DR}$. A more practical configuration of this delay circuit 4A is shown in FIG. 4. This delay circuit 4A is comprised of n number of flip-flops $5_1$ to $5_n$ connected in series, and serves to transfer reset signal $S_R$ from the left to the right in the figure in synchronism with the clock signal $f_{ex}$.

It is a matter of course that the second embodiment can also provide effects/advantages similar to those of the first embodiment.

In the above-mentioned second embodiment, in the case where the operation of the delay circuit 4 cannot follow clock signal $f_{ex}$ because speed of the clock signal $f_{ex}$ is high, a clock signal obtained by frequency-dividing the clock signal $f_{ex}$ is used.

Figure 5:
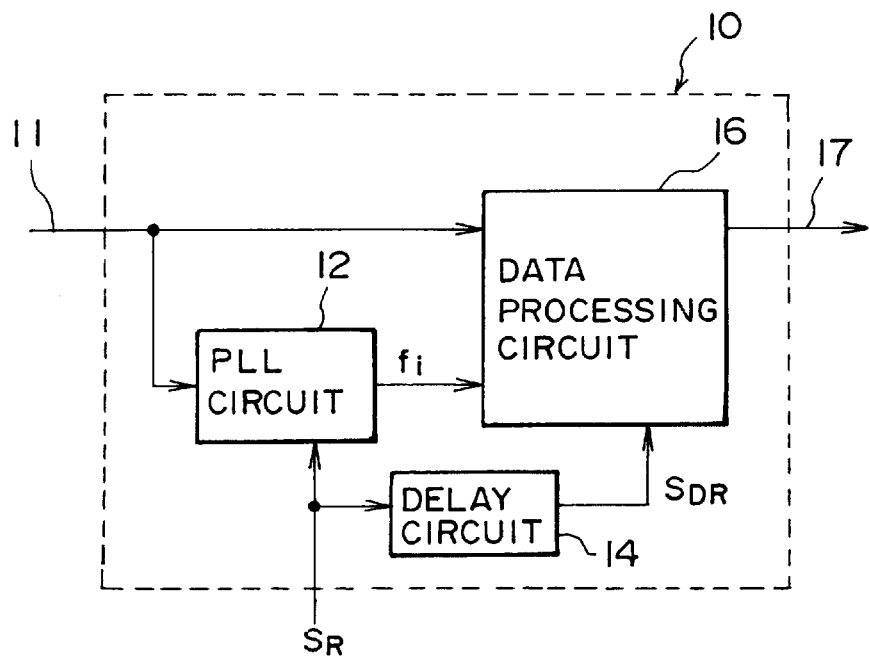
FIG. 5 is a block diagram showing the configuration of a third embodiment of this invention.

A third embodiment of a semiconductor integrated circuit device according to this invention will now be described with reference to FIG. 5. The semiconductor integrated circuit device of this embodiment is a communication control unit for carrying out control of the physical layer which corresponds to the lowest layer in the hierarchical protocol of communication. The configuration of the outline of the receiving side portion is shown in FIG. 5. In this case, the physical layer has a function to carry out interface between communication terminal and transmission path.

The communication control unit 10 of the third embodiment comprises a PLL circuit 12, a delay circuit 14 and a data processing circuit 16. The PLL circuit 12 is reset by a reset signal $S_R$ from the outside and serves to extract and reproduce a clock signal $f_i$ from received data 11. The delay circuit 14 delays the reset signal $S_R$ by a predetermined time to output a delayed reset signal $S_{DR}$.

The data processing circuit 16 includes a synchronous reset type flip-flop for taking thereinto delayed reset signal $S_{DR}$ in synchronism with clock signal $f_i$ from the PLL circuit 12, and serves to implement a predetermined processing to the received data 11 in synchronism with the clock signal $f_i$ to output data 17 thus processed to the control unit of the high order protocol hierarchy. The predetermined processing mentioned here is, e.g., conversion of data form and/or detection/correction of error, etc.

In the third embodiment, for a time period during which the PLL circuit 12 is reset by reset signal $S_R$, reproduction clock signal $f_i$ is not outputted. However, by resetting the synchronous reset type flip-flop within the data processing circuit 16 by reset signal $S_R$ through the delay circuit 14 similarly to the case of the first embodiment, reset operation, i.e., initialization of the data processing circuit 16, and furthermore, the entirety of the semiconductor integrated circuit device can be carried out.

Figure 6:
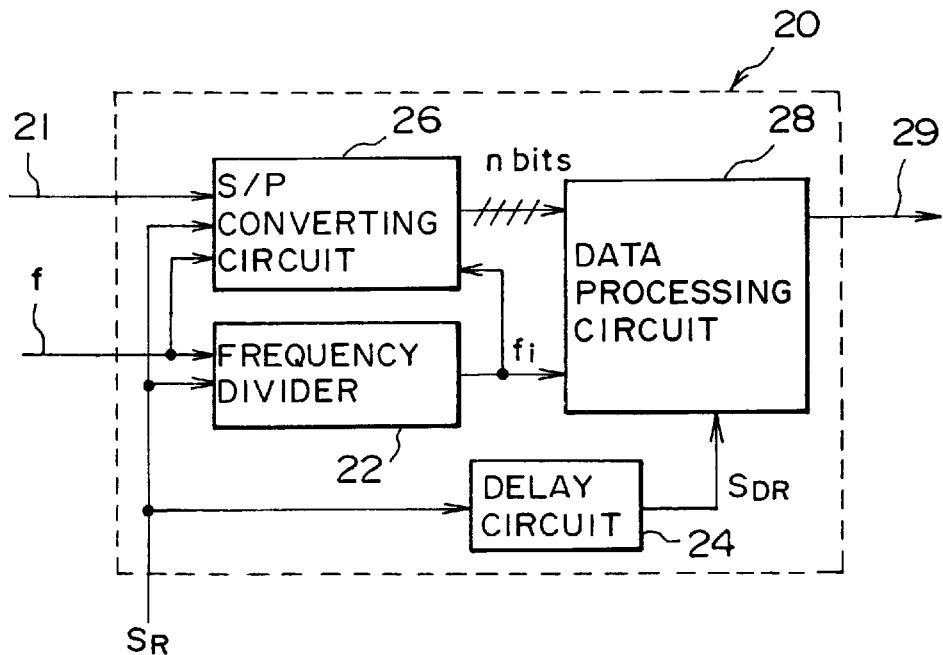
FIG. 6 is a block diagram showing the configuration of a fourth embodiment of this invention.
Figure 7:
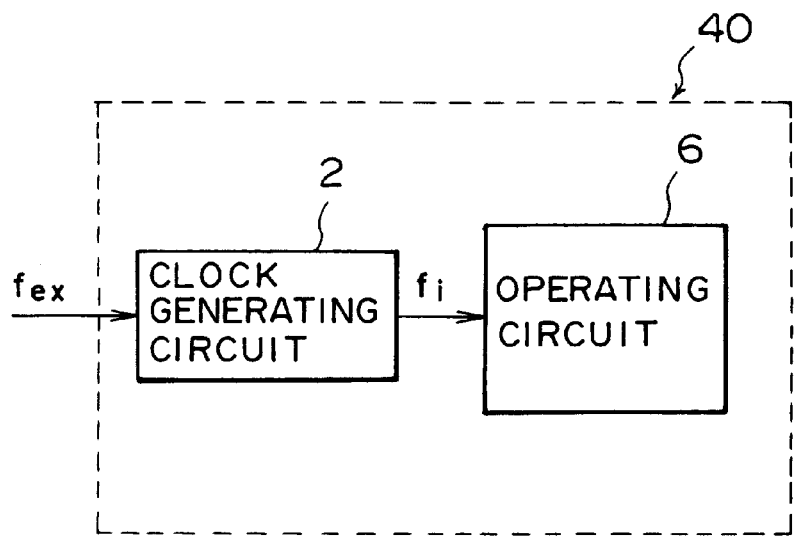
FIG. 7 is a block diagram showing the configuration of a conventional semiconductor integrated circuit device.
Figure 8:
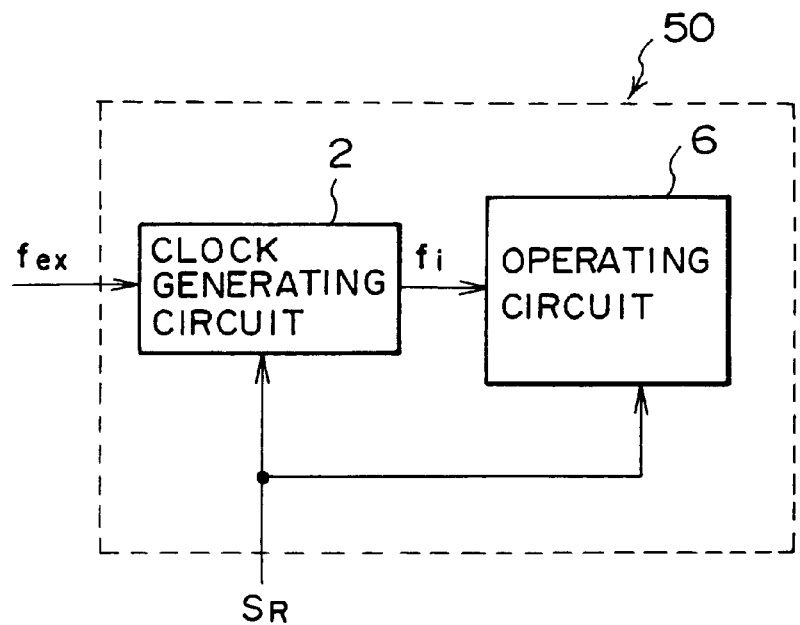
FIG. 8 is a block diagram showing another configuration of a conventional semiconductor integrated circuit device.

A fourth embodiment of a semiconductor integrated circuit device according to this invention will now be described with reference to FIG. 6. The semiconductor integrated circuit device of this embodiment is a communication control unit for carrying out control of the physical layer of the hierarchical protocol of communication similarly to the case of the third embodiment, and the configuration of the outline of the portion of the receiving side is shown in FIG. 6.

The communication control unit of the fourth embodiment is not such a unit for reproducing clock signal from received data as in the case of the communication control unit of the third embodiment, but is a communication control unit for independently receiving serial received data 21 and clock signal f synchronous with the received data 21.

The communication control unit of the fourth embodiment comprises a frequency-divider 22, a delay circuit 24, a serial/parallel (S/P) converting circuit 26, and a data processing circuit 28.

The frequency divider 22 serves to carry out frequency division of clock signal f sent in synchronism with received data 21 so that its frequency is changed into 1/n value to send out a frequency-divided clock signal $f_i$ to the data processing circuit 28. In this example, the frequency divider 22 is reset by reset signal $S_R$ from the outside. The delay circuit 24 delays the reset signal $S_R$ to send out a delayed signal $S_{DR}$ to the data processing circuit 28. The serial/parallel converting circuit 26 is reset by reset signal $S_R$ and converts received data 21 into n bit parallel data on the basis of the clock signal f. The data processing circuit 28 includes a synchronous reset type flip-flop for taking thereinto reset signal $S_{DR}$ in synchronism with the clock signal $f_i$ from the frequency divider 22, and serves to implement predetermined processing to the n bit parallel data in synchronism with the clock signal $f_i$ to output the data thus processed to the control unit of the high order protocol hierarchy. In this example, the predetermined processing mentioned here is, e.g., conversion of data form and/or detection/correction of error, etc.

In the communication control unit of this embodiment, for a time period during which the frequency divider 22 is reset by reset signal $S_R$, frequency-divided clock signal $f_i$ is not outputted. However, it becomes possible to reset the synchronous reset type flip-flop within the data processing circuit 28 by delayed reset signal $S_{DR}$. Thus, it becomes possible to carry out reset operation, i.e., initialization of the data processing circuit 28, and furthermore, the entirety of the communication control unit.

Further, in this control unit, clock is frequency-divided by the frequency divider 22 so that its frequency is changed into 1/n value, and received data 21 is converted from serial data into n bit parallel data by the serial/parallel (S/P) converting circuit 26. By carrying out control operation in this way, the data processing circuit 28 is permitted to be operative at a low speed as compared to the case where received data is caused to undergo serial processing. Particularly, it becomes possible to facilitate timing design of the communication control unit for controlling communication of high transfer rate.

As described above, in accordance with this invention, reliable reset operation can be carried out.

What is claimed is:

1. A semiconductor integrated circuit device comprising:
   a first circuit which is reset on the basis of a reset signal and serves to generate a clock signal;
   a delay circuit adapted to receive the reset signal to output a delayed reset signal; and
   a second circuit including a flip-flop operative in synchronism with the generated clock signal to take thereinto the delayed reset signal in synchronism with the generated clock signal.

2. A semiconductor integrated circuit device as set forth in claim 1,
   wherein the delay circuit is comprised of a RC integrating circuit or an inverter chain.

3. A semiconductor integrated circuit device as set forth in claim 1,
   wherein the delay circuit is a shift register operative in synchronism with a clock signal.

4. A semiconductor integrated circuit device as set forth in claim 1,
   wherein the first circuit is a frequency dividing circuit for frequency-dividing an external clock signal delivered from the outside to thereby generate the clock signal.

5. A semiconductor integrated circuit device as set forth in claim 4,
   wherein the delay circuit is comprised of a RC integrating circuit or an inverter chain.

6. A semiconductor integrated circuit device as set forth in claim 4,
   wherein the delay circuit is a shift register operative in synchronism with a clock signal.

7. A semiconductor integrated circuit device as set forth in claim 1,
   wherein the first circuit is a multiplication circuit for carrying out multiplication of an external clock signal delivered from the outside to thereby generate the clock signal.

8. A semiconductor integrated circuit device as set forth in claim 7,
   wherein the delay circuit is comprised of a RC integrating circuit or an inverter chain.

9. A semiconductor integrated circuit device as set forth in claim 7,
   wherein the delay circuit is a shift register operative in synchronism with a clock signal.

10. A semiconductor integrated circuit device as set forth in claim 1,
    wherein the first circuit is a PLL circuit for extracting the clock signal from input data delivered from the outside.

11. A semiconductor integrated circuit device as set forth in claim 10,
    wherein the delay circuit is comprised of a RC integrating circuit or an inverter chain.

12. A semiconductor integrated circuit device as set forth in claim 10,
    wherein the delay circuit is a shift register operative in synchronism with a clock signal.

13. A semiconductor integrated circuit device as set forth in claim 10,
    wherein the semiconductor integrated circuit device is a communication control unit for carrying out control of physical layer in hierarchical protocol of communication, and wherein the second circuit is a data processing unit for implementing a predetermined processing to the input data in synchronism with a clock signal outputted from the PLL circuit to deliver the data thus processed to a control unit of high order protocol hierarchy.

14. A semiconductor integrated circuit device as set forth in claim 13, wherein the delay circuit is comprised of a RC integrating circuit or an inverter chain.

15. A semiconductor integrated circuit device as set forth in claim 13, wherein the delay circuit is a shift register operative in synchronism with a clock signal.

16. A semiconductor integrated circuit device comprising a communication control unit, the communication control unit including:

a frequency divider which is reset by a reset signal and serves to carry out frequency division of an external clock signal sent from the outside so that its frequency is changed into 1/n value;

a serial/parallel converting circuit which is reset by the reset signal and serves to convert, on the basis of the external clock signal and a frequency-divided clock signal which is output of the frequency divider, serial received data sent in synchronism with the external clock signal into n bit parallel data;

a delay circuit adapted to receive the reset signal to output a delayed reset signal; and a data processing circuit including a flip-flop for taking thereinto the delayed reset signal in synchronism with the frequency-divided clock signal, and operative to implement a predetermined processing to the n bit parallel data in synchronism with the frequency-divided clock signal to deliver the parallel data thus processed to a control unit of high order protocol hierarchy.

17. A semiconductor integrated circuit device as set forth in claim 16, wherein the delay circuit is comprised of a RC integrating circuit and an inverter chain.

18. A semiconductor integrated circuit device as set forth in claim 16, wherein the delay circuit is a shift register operative in synchronism with a clock signal.

* * * * *